United States Patent
Chen et al.

(10) Patent No.: US 6,880,118 B2
(45) Date of Patent: Apr. 12, 2005

(54) SYSTEM AND METHOD FOR TESTING OPERATIONAL TRANSMISSIONS OF AN INTEGRATED CIRCUIT

(75) Inventors: Cecilia T. Chen, Alameda, CA (US); Jyh-Ming Jong, Saratoga, CA (US); Wai Fong, San Jose, CA (US); Leo Yuan, Los Altos, CA (US); Brian L. Smith, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 497 days.

(21) Appl. No.: 09/999,877

(22) Filed: Oct. 25, 2001

(65) Prior Publication Data

US 2003/0080769 A1 May 1, 2003

(51) Int. Cl.[7] ............................................... G01R 31/28
(52) U.S. Cl. ............................... 714/727; 714/729
(58) Field of Search ............................. 714/727, 729, 714/724, 736, 738, 726, 731, 733, 742; 324/765

(56) References Cited

U.S. PATENT DOCUMENTS

| | | | | |
|---|---|---|---|---|
| 5,517,515 A | * | 5/1996 | Spall et al. ................. | 714/733 |
| 5,568,492 A | * | 10/1996 | Flint et al. ................... | 714/724 |
| 5,657,330 A | | 8/1997 | Matsumoto | |
| 5,701,309 A | * | 12/1997 | Gearhardt et al. .......... | 714/736 |
| 6,055,661 A | | 4/2000 | Luk | |
| 6,253,341 B1 | | 6/2001 | Sugizaki | |
| 6,304,987 B1 | | 10/2001 | Whetsel, Jr. | |
| 6,347,387 B1 | * | 2/2002 | Fischer ....................... | 714/738 |
| 6,452,411 B1 | * | 9/2002 | Miller et al. ................ | 324/765 |
| 6,456,103 B1 | * | 9/2002 | Eldridge et al. ............ | 324/765 |
| 6,499,121 B1 | * | 12/2002 | Roy et al. ................... | 714/724 |

* cited by examiner

Primary Examiner—David Ton
(74) Attorney, Agent, or Firm—Robert C. Kowert; Meyertons, Hood, Kivlin, Kowert & Goetzel, P.C.

(57) ABSTRACT

A source synchronous test methodology and apparatus. In one embodiment, an integrated circuit (IC) configured for source synchronous I/O transactions may be a device under test (DUT) and may be mounted to a load board for testing. The load board may be electrically coupled to a test system. The test system may shift first test data into a first IC on the load board. The first chip may then transmit the first test data through a source synchronous line, or a source synchronous link having a plurality of lines, to a second IC. Second test data produced responsive to the source synchronous transmission is then shifted from the second IC to the tester. The second test data is then analyzed. The analysis may comprise comparing the second data to expected data, and/or may also comprise analyzing the second data with respect to an eye window.

73 Claims, 4 Drawing Sheets

SYSTEM AND METHOD FOR TESTING OPERATIONAL TRANSMISSIONS OF AN INTEGRATED CIRCUIT

BACKGROUND OF THE INVENTION

1. Field of the Invention

This invention relates to the testing of electronic circuits, and more specifically the testing of integrated circuits.

2. Description of the Related Art

As electronic circuits become more complex, test requirements to ensure their reliability and functionality become more demanding. This is particularly true of integrated circuits. As integrated circuits (ICs) have advanced, both pin counts and transistor counts have increased dramatically, thereby placing greater demands on testing methods to ensure their reliability. In addition to integrated circuits becoming more complex, system boards upon which many ICs are implemented have become more complex as well.

Characterization testing is one type of testing commonly performed on integrated circuits, both in the design verification stage as well as the production stage. Characterization testing may include various test methods to ensure that a device under test (DUT) meets electrical specifications. In a typical characterization test, the DUT will be coupled to a printed circuit board (PCB) known as a load board, which is then coupled to an automated test system. The automated test system may provide various electrical stimuli to the DUT, through the load board. The test system may then observe the response of the DUT to the various electrical stimuli, comparing the responses with predefined electrical specifications in order to determine whether the device has passed or failed.

System level or functional testing is another type of testing performed on ICs. This type of testing may occur after a given IC has been mounted to a printed circuit board, or other type of carrier. For example, the IC may be an ASIC (application specific IC) that is mounted on a system board. When assembly of the system board is complete, the board may undergo testing to ensure that it functions as required. This may include testing the ability of the ASIC to communicate correctly with the various other chips on the board, as well as with an environment to an external board (e.g. a daughter card coupled to the system board).

Discrepancies may arise between characterization testing and system level testing. For example, an IC may successfully pass all characterization tests, but may still be unable to function properly on a system board. These discrepancies may be exacerbated by tolerance stack ups on both the IC and the system board, or other electrical factors that were not considered during the characterization testing.

The problems of testing IC's may be particularly acute for those IC's configured for source synchronous I/O. In an IC configured for source synchronous I/O, a clock signal is transmitted along with a data transmission in order to ensure that the data is synchronized at the receiver. Because of the high speeds at which source synchronous devices operate, clock skew and other factors may play a significant role in determining their operability on a system board. As such, the margin of operation in a characterization test for a source synchronous IC may be extremely small.

SUMMARY OF THE INVENTION

A method and apparatus for an I/O test methodology are described herein. In one embodiment, an integrated circuit (IC) configured for source synchronous I/O transactions may be a device under test (DUT). The DUT may be mounted to a load board for the purposes of testing, along with a reference IC. The load board may be electrically coupled to a test system. The test system may shift first test data into a first IC on the load board. The first chip may then transmit the first test data through a source synchronous line, or a source synchronous link having a plurality of source synchronous lines, to a second IC. Second test data may be produced by the second IC responsive to the source synchronous transmission, which may then be shifted from the second IC to the tester. Furthermore, the second test data may be produced responsive to the performance of a built-in self-test (BIST). The second test data may then be analyzed. The analysis may comprise comparing the second data to expected data, and/or may also comprise analyzing the second data with respect to an eye window or eye pattern. In one embodiment, the first IC may be a reference IC and the second IC is the DUT. In another embodiment, the first IC may be the DUT, while the second IC is the reference IC.

Various embodiments of the method and apparatus that are clock synchronous (i.e. a single, common, system-wide clock is provided), asynchronous, or have a clock signal embedded within a data stream are also possible and contemplated.

In one embodiment, first test data may be shifted from the test system into the first IC through a JTAG (Joint Test Action Group, i.e. scan) port. The first test data may be shifted from the test system into the first IC through the TDI (test data in) pin of the IC. The first test data may then be shifted through the scan chain of the first IC to a source synchronous output. The first IC may then transmit the first data through the source synchronous output to a source synchronous input of the second IC. The transmission of the first test data from a source synchronous output to a source synchronous input may include an interconnect built-in self-test (IBIST). The IBIST may be a built-in self-test configured for testing the interconnections between two IC's.

Second test data may be produced responsive to the transmission of the first test data and/or the conducting of the interconnect built-in self-test. The second test data may then be shifted through the scan chain of the second IC, through the TDO (test data out) pin, and into the test system. The second test data may then be analyzed to determine the pass/fail status of the DUT.

The load board to which the DUT and the reference IC are mounted may be designed in order to closely emulate the electrical environment of a system board for which an IC of the same design as the DUT may be implemented. The load board may electrically couple the first IC and second IC to the test system. In one embodiment, the load board may electrically couple the first IC and the second IC to the test system through the JTAG port of the test system. Coupling the IC's to the test system primarily through the JTAG port may minimize the number of tester-to-IC electrical connections required for testing, which may allow for reduced test system cost. Furthermore, using a minimal number of connections between the test system and the load board may allow for more accurate emulation of the electrical environment in which the IC's (i.e. the DUT) will be implemented.

The method and apparatus described herein may be used for production test, and may also be used for the various testing that occurs during the design or revision phase of an IC, such as debug and characterization testing. Characterization testing may include establishing margins of operation, and may also include determining best and worst-case scenarios for chip operating environments.

BRIEF DESCRIPTION OF THE DRAWINGS

Other aspects of the invention will become apparent upon reading the following detailed description and upon reference to the accompanying drawings in which.

Figure 1:
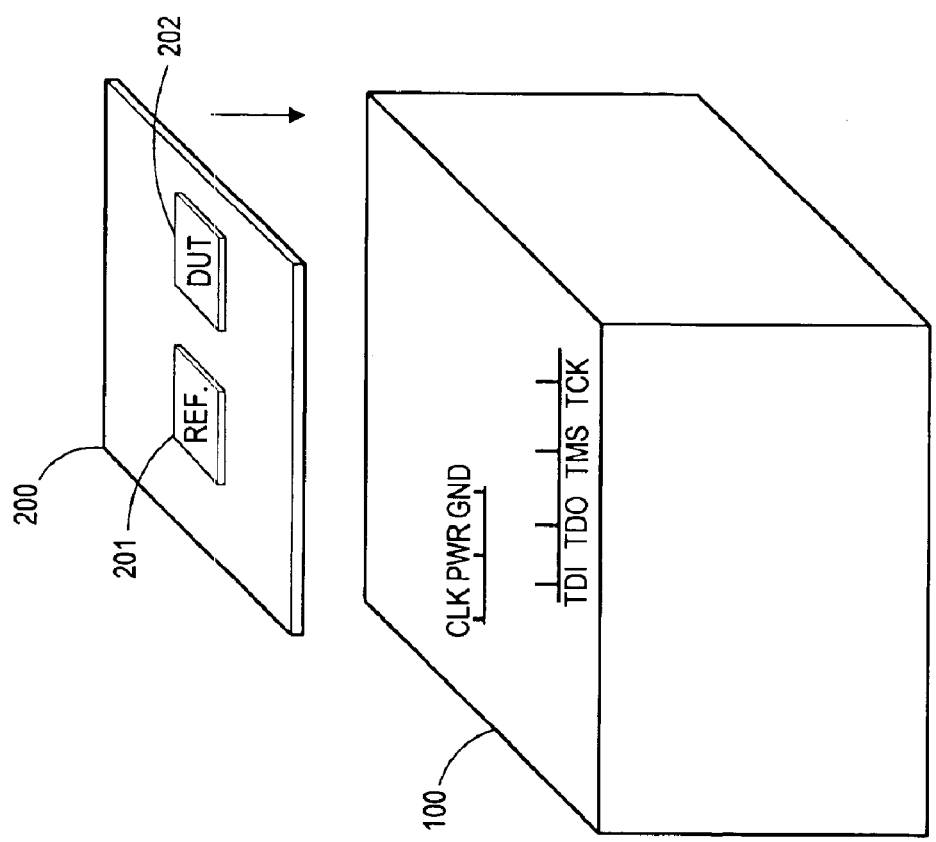
FIG. 1 is a drawing of one embodiment a system for testing an integrated circuit (IC) including a test system and a load board having a reference IC and a device under test (DUT)

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, is a drawing of one embodiment a system for testing an integrated circuit (IC) including a test system and a load board having a reference IC and a device under test (DUT) is shown. A reference IC may be defined as an IC that has been verified to meet all functional specifications and electrical characteristic requirements. In some embodiments, the reference IC may meet most or all of the specifications at nominal values, or with a maximum margin of operation. In other embodiments, the reference IC may meet required specifications with little or no margin for operation, allowing the DUT to be tested under a "worst-case" scenario.

In the embodiment shown, test system 100 is configured to be coupled to a system load board 200. Reference IC 201 and device under test (DUT) 202 are mounted upon load board 200. Reference IC 201 and DUT 202 may be mounted in any manner which provides a reliable electrical connection between the IC's and load board 200. Load board 200 may be configured to closely emulate the electrical environment of a system board or other type of circuit in which an IC of the same design as DUT 202 is to be implemented. In some cases, the required design of load board 200 may be complicated, and thus may necessitate the testing of a subset of the links between reference IC 201 and DUT 202 instead of testing all links.

Test system 100 may be configured to be electrically coupled to load board 200 through one or more signal connections. In the embodiment shown, the primary signal connections through which test system 100 is coupled to load board 200 are JTAG (Joint Test Action Group, i.e. scan) connections of a JTAG port. Load board 200 may include one or more scan paths, each of which may be coupled to reference IC 201 and DUT 202. Similarly, both reference IC 201 and DUT 202 may have an internal scan chain. In the embodiment shown, the JTAG connections include a TDI (test data in) pin, a TDO (test data out) pin, a TMS (test mode select) pin, and a TCK (test clock) pin. The TDI pin may be used by test system 100 to receive test data from either reference IC 201 or DUT 202. The test data may be shifted out from a scan path on the load board into the test system, where it may be analyzed by the test system to determine the pass/fail status of the DUT. The TDO pin may be used to shift test data into a scan path on the load board, where it may be received by reference IC 201 or DUT 202. The TMS pin may be used to assert a signal which enables data to be shifted through the scan chain of the load board, reference IC 201, and DUT 202. The TCK pin may drive a clock signal to load board 200. The clock signal driven to the load board through the TCK pin may be used for shifting data into, through, and out of the scan chains which may be present on load board 200, reference IC 201, and DUT 202. In one embodiment, the test system may include a clock source to provide the test clock and other clock signals that may be necessary, such as high-speed clocks for DUT 202.

It should be noted that the term 'data' as used herein may comprise commands and/or indications used to invoke various functions of either reference IC 201 or DUT 202 (e.g. invoking a built-in self-test [BIST]).

In addition to the signal connections shown, test system 100 may be electrically coupled to load board 200 with additional signal connections in some embodiments. Furthermore, power and ground connections may also be present in some embodiments, thereby allowing tester 100 to provide the necessary power to load board 200.

It should also be noted that embodiments are possible and contemplated wherein multiple devices (i.e. multiple DUTs) may be tested on a single load board. Similarly, embodiments wherein multiple reference IC's may be used to test a single DUT are also possible and contemplated. The ability to test multiple chips using a single reference IC or use multiple reference chips to test a single IC may be utilized when there are mismatches between the numbers or types of inputs/outputs of the DUT and the reference IC, or in cases where it may more closely emulate the electrical environment in which the DUT is to operate. Testing may also be conducted for worst case and/or best case electrical environments.

Figure 2:
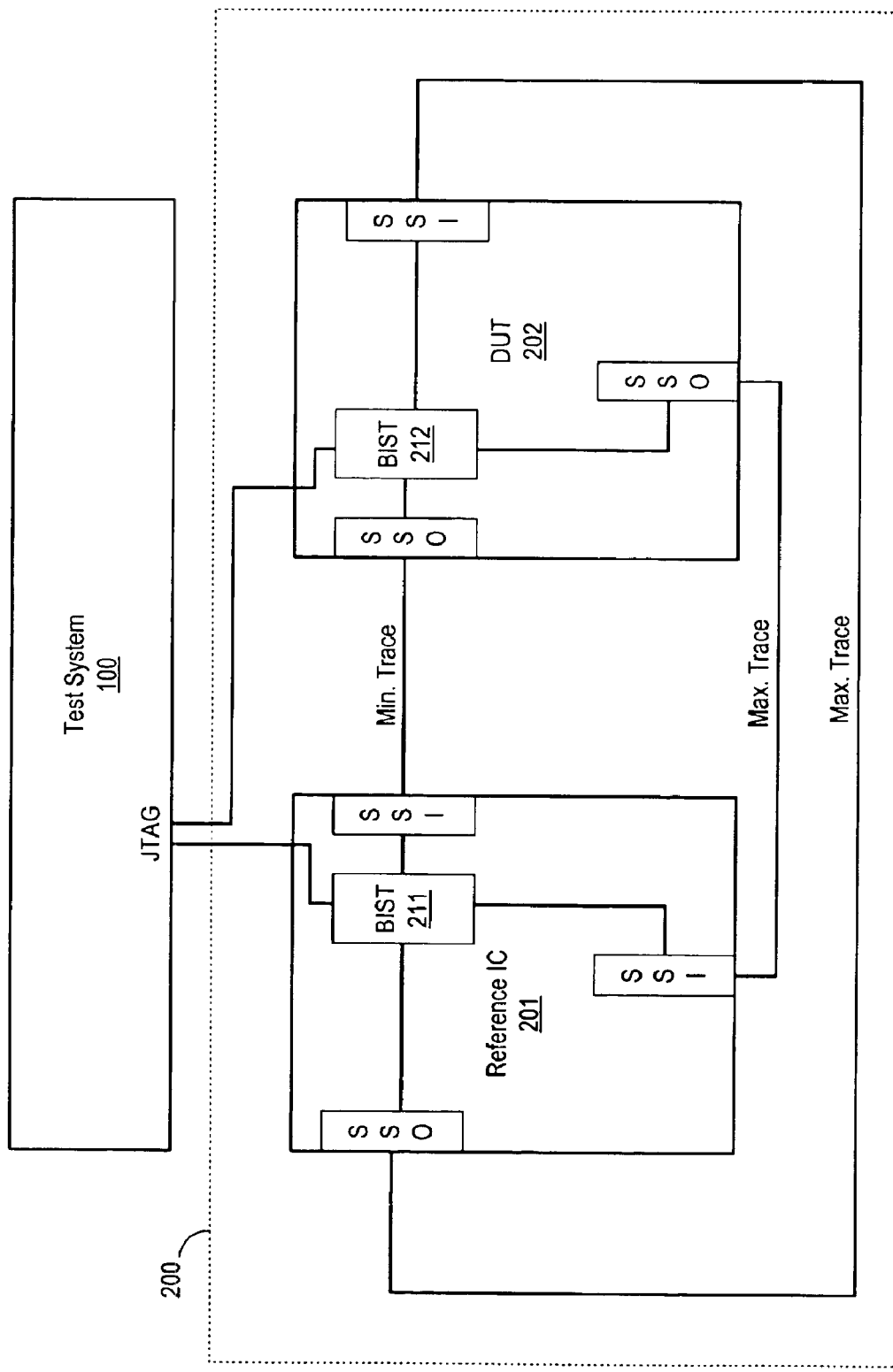
FIG. 2 is a block diagram of one embodiment of a system for testing an IC including a test system and a load board having a reference IC and a DUT.

Moving now to FIG. 2, a block diagram of one embodiment of a system for testing an IC including a test system and a load board having a reference IC and a DUT is shown. The block diagram may be for an embodiment similar to that illustrated in FIG. 1. Test system 100 may be coupled to load board 200 through a JTAG port. Load board may include two integrated circuits, reference IC 201 and DUT 202. In the embodiment shown, both reference IC 201 and DUT 202 may be configured to perform source synchronous transactions, although other embodiments are possible and contemplated. Source synchronous I/O (SSIO) may be used in high-speed digital systems. In a typical SSIO transaction, a clock signal may be concurrently transmitted from the source IC to the receiving IC along with the data transmission. This may allow for greater data integrity in high-speed digital systems relative to those which implement a single, common clock for all devices. In one embodiment, each IC includes at least one source synchronous output, for transmitting data, and at least one source synchronous input, for receiving data. Source synchronous transactions may occur on a line-by-line basis, or on a link-by-link basis, where each link includes a plurality of source synchronous lines.

In one embodiment, reference IC 201 and DUT 202 may be integrated circuits of the same design, and therefore, perform the same function. Other embodiments are possible and contemplated where reference IC 201 and DUT 202 are configured to perform different functions while maintaining the ability to communicate with each other. Reference IC 201 may be a particular instance of an integrated circuit that has been determined to meet all required operating specifications. Reference IC 201 may be determined to perform optimally for one or more of the required operating specifications, which may increase its usefulness for testing purposes. DUT 202 may also be a particular instance of an integrated circuit. In one embodiment, DUT 202 may be an integrated circuit in the prototype phase of a design cycle. The testing of DUT 202 may be used for characterization of its particular design, and to determine if it meets its electrical and other operating specifications. In another embodiment, the testing of DUT 202 may be performed as production testing, ensuring that each instance of a particular IC meets its electrical and operating specifications prior to mounting the IC to an assembly that is to be shipped to a customer.

For both source synchronous and clock synchronous embodiments, tests may be conducted wherein the transmission or reception of a clock signal is delayed relative to transmitted data signals. This may be useful for establishing margins for ensuring that there is sufficient margin for setup time and hold time. In some cases, such testing may be able to establish worst-case scenarios under which the DUT may operate. Testing may be conducted for various delay times between the clock signal and the one or more data signals. Other types of margins may be checked.

In the embodiment shown, the source synchronous inputs and outputs are electrically connected to each other by circuit traces of various lengths. Shown here are trace lengths of a maximum length, designated 'Max. Trace', and a minimum length, designated 'Min. Trace'. The maximum length trace may be a signal trace of a length equivalent to the maximum length that may be present in a system in which DUT 202 is to be implemented. Similarly, the minimum length trace may be a signal trace of a length equivalent to the minimum that may be present in a system in which the DUT 202 is to be implemented. Transmissions across the various trace lengths may be used to ascertain performance for various scenarios, including worst-case scenarios. This may help verify the ability to de-skew signals across various trace lengths and various delays.

Reference IC 201 includes a BIST engine 211 while DUT 202 includes a BIST engine 212. BIST engines 211 and 212 may be configured for performing various types of built-in self-tests, and may be functionally equivalent to each other. Various types of tests may be conducted, including tests of interconnections between chips, as well as internal chip logic. BIST engines 211 and 212 may be connected to both transmitters and receivers in their respective chips in order to convey test data, commands, or results to the other chip(s) on the load board or to the test system.

Figure 3A:
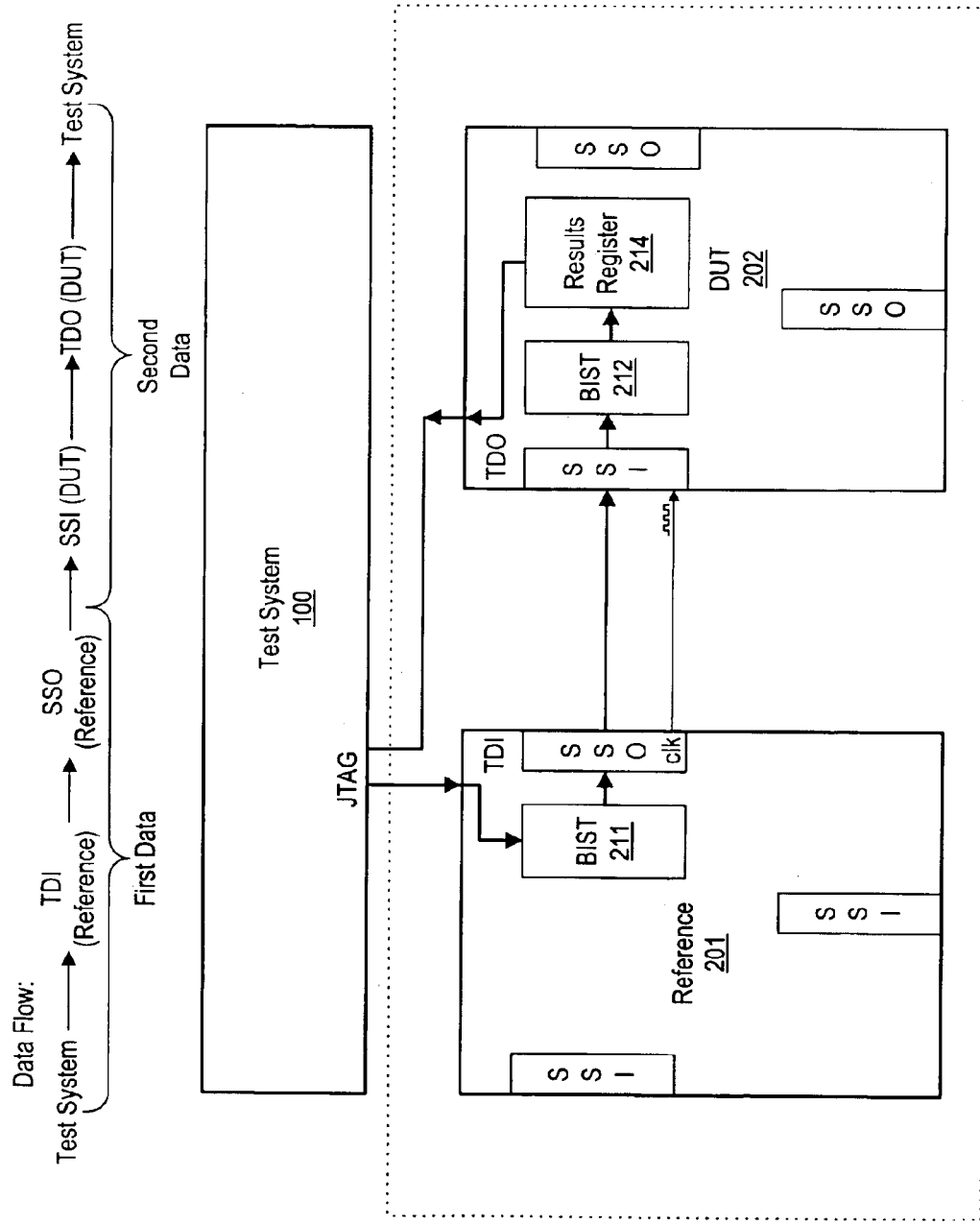
FIG. 3A is a block diagram of one embodiment of a system for testing an IC, wherein a source synchronous input of the DUT is tested.

FIG. 3A is a block diagram of one embodiment of a system for testing an IC, wherein a source synchronous input of the DUT is tested. In the embodiment shown, reference IC 201 is configured for source synchronous data transmissions to DUT 202. Reference IC 201 may receive first test data from the tester through its TDI pin, while DUT 202 may return second test data to the tester through its TDO pin.

For the purposes of this discussion, first test data may be any data shifted from the JTAG port of the tester to a first IC, which may be either reference IC 201 or DUT 202. More generally speaking, first test data may comprise data, commands, or indications. A second IC may also be either reference IC 201 or DUT 202. For example, in the embodiment shown in FIG. 5A, reference IC 201 is configured to receive first test data from test system 100, and is therefore the first IC, while DUT 202 is configured to convey second test data to test system 100, and is therefore the second IC. First test data may take on various forms. In one embodiment, first test data may comprise a test vector that is to be transmitted from a source synchronous output of the first IC to a source synchronous input of a second IC. In another embodiment, first test data may comprise control data and/or commands used to invoke a built-in self-test (BIST) of an IC. In general, first test data may take on any format that may be necessary to conduct testing of an IC, and may be altered prior to transmission through the source synchronous output of the first IC. Similarly, second test data may take on a variety of formats as well. In one embodiment, second test data may comprise a direct copy or an inverted copy of data transmitted to the second IC. In another embodiment, second test data may comprise one or more pass/fail signals for one or more tests conducted. In general, second test data may be considered to be a response to the stimulus (i.e. the first test data).

In the embodiment shown, first test data may be shifted from the JTAG port of test system 100 into the TDI pin of reference IC 201, which acts as the first IC in this embodiment. Reference IC 201 may then shift the data through a scan chain to a source synchronous output. The source synchronous output may be a single source synchronous line, a group of source synchronous lines, or an entire source synchronous link. In one embodiment, the first test data may then be transmitted from the source synchronous output of reference IC 201 to the source synchronous input of DUT 202. In another embodiment, first test data may be used to invoke a BIST, such as an interconnect BIST that tests the interconnection between reference IC 201 and DUT 202. In yet another embodiment, first test data may be transmitted to DUT 202 in order to invoke an internal BIST within DUT 202, such as an internal logic BIST.

Second test data may be produced by the second IC (DUT 202 in this example) responsive to receiving data at its source synchronous input. In one embodiment, second test data may be identical to the first test data, assuming proper operation of the interconnection between the source synchronous inputs and outputs. In another embodiment, second test data may be a direct inversion of first test data when the interconnection is functioning correctly. For these examples, second test data may take on an unexpected form if the particular test conducted results in a failure. In embodiments where a BIST is invoked, second test data may take on the form of one or more indications of whether a particular test passed or failed.

Following completion of a particular test, second test data may be shifted from the receiver of DUT 202 to a BIST engine 212, and on to a results register 214. BIST engine 212 may determine results (second test data) from the tests that were conducted, and forward these results to results register 214, where they may be temporarily stored. Eventually second test data shifted out of the second IC through the TDO pin into test system 100. Test system 100 may then perform an analysis on the second test data. The results of the particular test or tests conducted may then be conveyed to an operator of test system 100. For this particular example, test system 100 may ascertain the performance of a source synchronous input of DUT 202. Test system 100 may also convey the results of various other types of tests (e.g. BIST) to a test system operator.

Figure 3B:
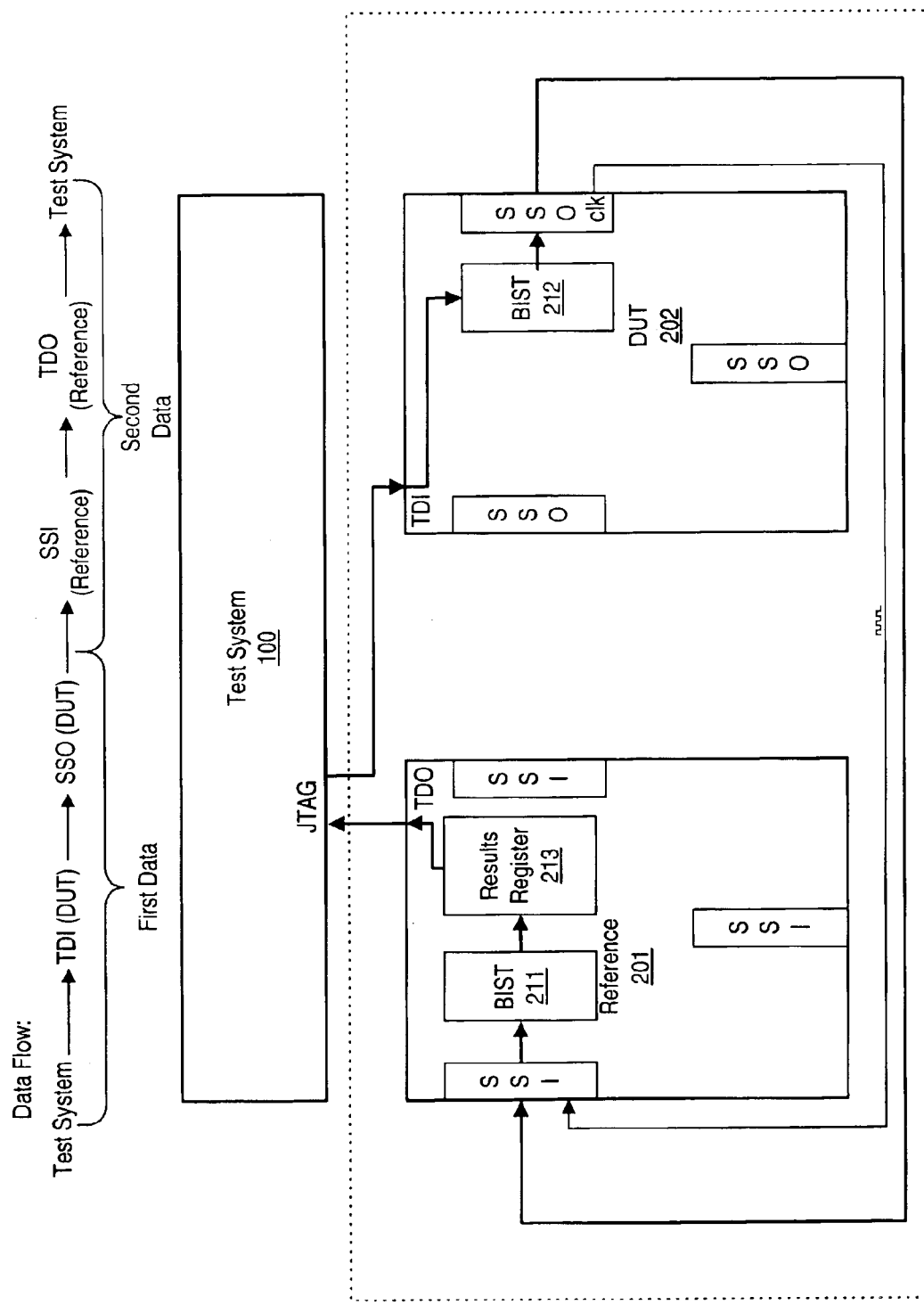
FIG. 3B is a block diagram of one embodiment of a system for testing an IC, wherein a source synchronous output of the DUT is tested.

FIG. 3B is a block diagram of one embodiment of a system for testing an IC, wherein a source synchronous output of the DUT is tested. In this embodiment, DUT 202 acts as the first IC and is configured to receive first test data from test system 100. First test data may then be shifted through the scan chain of DUT 202 to a source synchronous output. First test data may then be transmitted from the source synchronous output of DUT 202 to a source synchronous input of reference IC 201 (i.e. the second IC in this example). Reference IC 201 may then produce second test data based on the particular type of test(s) conducted, responsive to receiving first test data at the source synchronous input to which it was received. Following the producing of second test data at the input (i.e. receiver), second test data may be forwarded to BIST engine 211 and results register 213. Second test data may then be shifted through the scan chain of reference IC 201, through its TDO pin, and into test system 100 through the JTAG port. Test system 100 may then perform any necessary analysis of second test data, and convey the results of the test(s) conducted to a test system operator.

It should be noted that, while many of the embodiments of the method and apparatus described herein involve source synchronous I/O, other embodiments are possible and contemplated. Such embodiments include clock synchronous 10 (wherein a single, common clock signal is employed system-wide) or asynchronous 10.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method for testing an integrated circuit, the method comprising:
    shifting first test data from a JTAG port of a test system into a test data input of a first integrated circuit (IC);
    shifting first test data through a scan path in the first IC to a transmitter of the first IC;
    transmitting in an operational manner the first test data from the transmitter of the first IC to a receiver of a second IC;
    shifting second test data from the receiver through a scan path in the second IC to a test data output of the second IC;
    shifting the second test data from the test data output into the JTAG port of the test system; and
    analyzing the second test data to determine a pass/fail status for a device under test, wherein the device under test is the first IC or the second IC.

2. The method as recited in claim 1, wherein the first IC is a reference IC and the second IC is the device under test.

3. The method as recited in claim 1, wherein the first IC is the device under test and the second IC is a reference IC.

4. The method as recited in claim 2 or 3, wherein the reference IC is an IC determined to meet all functional requirements and all electrical characteristic requirements.

5. The method as recited in claim 1, wherein the transmitter and the receiver are configured for source synchronous transmissions.

6. The method as recited in claim 1, wherein the transmitter and the receiver are configured for asynchronous transmissions.

7. The method as recited in claim 1, wherein the transmitter and the receiver are configured for transmissions synchronized to a single system-wide clock.

8. The method as recited in claim 1 further comprising conducting an interconnect built-in self test between the transmitter of the first IC and the receiver of the second IC, wherein conducting the interconnect built-in self test comprises testing signal connections between the first IC and the second IC.

9. The method as recited in claim 1, wherein the first test data comprises a test pattern having a plurality of bits, and wherein the test pattern is serially shifted from the JTAG port to the test data input of the first IC.

10. The method as recited in claim 1, wherein the first test data comprises a command to the first IC to invoke a test sequence.

11. The method as recited in claim 1, wherein the second test data is produced responsive to said transmitting the first test data from the transmitter of the first IC to the receiver of the second IC.

12. The method as recited in claim 11, wherein the second test data comprises a pattern having a plurality of bits, and wherein the second test data is shifted from the test data output of the second IC into the JTAG port of the test system.

13. The method as recited in claim 12, wherein said analyzing comprises comparing the second test data to an expected data pattern.

14. The method as recited in claim 11, wherein the second test data comprises a pass/fail indication, the pass/fail indication produced responsive to conducting a test between the first IC and the second IC.

15. A system for testing an integrated circuit, the system comprising
    a test system having a JTAG port;
    a load board coupled to the JTAG port, wherein a first IC and a second IC are electrically coupled to the load board;
    wherein the system is configured to:
        shift first test data from a JTAG port a test data input of the first IC;
        shift the first test data through a scan path in the first IC to a transmitter of the first IC;
        transmit in an operational manner the first test data from the transmitter of the first IC to a receiver of the second IC;
        shift the second test data from the receiver through a scan path in the second IC to a test data output of the second IC;
        shift the second test data from the test data output into the JTAG port; and
        analyze the second test data to determine a pass/fail status for a device under test, wherein the device under test is the first IC or the second IC.

16. The system as recited in claim 15, wherein the first IC is a reference IC and the second IC is the device under test.

17. The system as recited in claim 15, wherein the first IC is the device under test and the second ship is the reference IC.

18. The system as recited in claim 16 or 17, wherein the reference IC is an IC determined to meet all functional requirements and all electrical characteristic requirements.

19. The system as recited in claim 15, wherein the transmitter and the receiver are configured for source synchronous transmissions.

20. The system as recited in claim 15, wherein the transmitter and the receiver are configured for asynchronous transmissions.

21. The system as recited in claim 15, wherein the transmitter and the receiver are configured for transmissions synchronized to a single system-wide clock.

22. The system as recited in claim 15, wherein the system is further configured to conduct an interconnect built-in self test between the transmitter of the first IC and the receiver of the second IC, wherein conducting the interconnect built-in self test comprises testing signal interconnections between the first IC and the second IC.

23. The system as recited in claim 15, wherein the first test data comprises a test pattern having a plurality of bits, and wherein the test pattern is serially shifted from the JTAG port to the test data input of the first IC.

24. The systems as recited in claim 15, wherein the first test data comprises a command to the first IC to invoke a test sequence.

25. The system as recited in claim 24, wherein the second test data comprises a pattern having a plurality of bits, and wherein the test system is further configured to shift the second test data from the test data output of the second IC to the JTAG port of the test system.

26. The system as recited in claim 24, wherein the second test data comprises a pass/fail indication, the pass/fail indication produced responsive to conducting a test between the first IC and the second IC.

27. The system as recited in claim 15, wherein the second test data is produced responsive to transmitting the first test data from the transmitter of the first IC to the receiver of the second IC.

28. The system as recited in claim 27, wherein analyzing the second test data comprises comparing the second test data to an expected data pattern.

29. A system for testing an integrated circuit, comprising:
    means for driving a first set of signals from a test system to a JTAG input of a first IC;
    means for invoking a test responsive to the fist IC's JTAG input receiving signals, wherein the test results in I/O transmissions in an operational manner between the first IC and a second IC;
    means for driving a second set of signals from a JTAG output from the second IC to the test system; and
    means for determining a pass/fail status for a device under test based on the second set of signals.

30. The system as recited in claim 29, wherein the first IC is a reference IC and the second IC is the device under test.

31. The system as recited in claims 30, wherein the reference IC is an IC determined to meet all functional requirements and all electrical characteristic requirements.

32. The system as recited in claim 29, wherein the first IC is the device under test and the second IC is a reference IC.

33. The system as recited in claims 32, wherein the reference IC is an IC determined to meet all functional requirements and all electrical characteristic requirements.

34. The system as recited in claim 29, wherein, in the I/O transmissions between the first IC and the second IC, the first IC and the second IC are configured for source synchronous transmissions.

35. The system as recited in claim 29, wherein, in the I/O transmissions between the first IC and the second IC, the first IC and the second IC are configured for asynchronous transmissions.

36. The system as recited in claim 29, wherein, in the I/O transmissions between the first IC and the second IC, the first IC and the second IC are configured for transmissions synchronized to a single system-wide clock.

37. The system as recited in claim 29, further comprising means for conducting an interconnect built-in self test between a transmitter of the first IC and a receiver of the second IC, wherein means for conducting the interconnect built-in self test comprises means for testing signal connections between the first IC and the second IC.

38. The system as recited in claim 29, wherein the first test data comprises a test pattern having a plurality of bits, and wherein the test pattern is serially shifted from the test system to the JTAG input of the first IC.

39. The system as recited in claim 29, wherein the first test data comprises a command to the first IC to invoke a test sequence.

40. The system as recited in claim 29, wherein the second test data is produced responsive to the I/O transmissions between the first IC and a second IC.

41. The system as recited in claim 40, wherein the second test data comprises a pattern having a plurality of bits.

42. The system as recited in claim 41, wherein said means for determining comprises means for comparing the second test data to an expected data pattern.

43. The system as recited in claim 40, wherein the second test data comprises a pass/fail indication, the pass/fail indication produced responsive to conducting a test between the first IC and the second IC.

44. A method for testing an integrated circuit, the method comprising:
    driving a first set of signals from a test system to a JTAG input of a first IC;
    invoking a test responsive to the fist IC's JTAG input receiving signals, wherein the test results in I/O transmissions in an operational manner between the first IC and a second IC;
    driving a second set of signals from a JTAG output from the second IC to the test system; and
    determining a pass/fail status for a device under test based on the second set of signals.

45. The method as recited in claim 44, wherein the first IC is a reference IC and the second IC is the device under test.

46. The method as recited in claims 45, wherein the reference IC is an IC determined to meet all functional requirements and all electrical characteristic requirements.

47. The method as recited in claim 44, wherein the first IC is the device under test and the second IC is a reference IC.

48. The method as recited in claims 47, wherein the reference IC is an IC determined to meet all functional requirements and all electrical characteristic requirements.

49. The method as recited in claim 44, wherein, in the I/O transmissions between the first IC and the second IC, the first IC and the second IC are configured for source synchronous transmissions.

50. The method as recited in claim 44, wherein, in the I/O transmissions between the first IC and the second IC, the first IC and the second IC are configured for asynchronous transmissions.

51. The method as recited in claim 44, wherein, in the I/O transmissions between the first IC and the second IC, the first IC and the second IC are configured for transmissions synchronized to a single system-wide clock.

52. The method as recited in claim 44, further comprising conducting an interconnect built-in self test between a transmitter of the first IC and a receiver of the second IC, wherein conducting the interconnect built-in self test comprises testing signal connections between the first IC and the second IC.

53. The method as recited in claim 44, wherein the first test data comprises a test pattern having a plurality of bits, and wherein the test pattern is serially shifted from the test system to the JTAG input of the first IC.

54. The method as recited in claim 44, wherein the first test data comprises a command to the first IC to invoke a test sequence.

55. The method as recited in claim 44, wherein the second test data is produced responsive to the I/O transmissions between the first IC and a second IC.

56. The method as recited in claim 55, wherein the second test data comprises a pattern having a plurality of bits.

57. The method as recited in claim 56, wherein said determining comprises comparing the second test data to an expected data pattern.

58. The method as recited in claim 55, wherein the second test data comprises a pass/fail indication, the pass/fail indication produced responsive to conducting a test between the first IC and the second IC.

59. A system for testing an integrated circuit, the system comprising:
- a test system having a JTAG port; and
- a load board coupled to the JTAG port, wherein a first IC and a second IC are electrically coupled to the load board; and
- wherein the system is configured to:
  - drive a first set of signals from a test system to a JTAG input of a first IC;
  - invoke a test responsive to the fist IC's JTAG input receiving signals, wherein the test results in I/O transmissions in an operational manner between the first IC and a second IC;
  - drive a second set of signals from a JTAG output of the second IC to the test system; and
  - determine a pass/fail status for a device under test based on the second set of signals.

60. The system as recited in claim 59, wherein the first IC is a reference IC and the second IC is the device under test.

61. The system as recited in claims 60, wherein the reference IC is an IC determined to meet all functional requirements and all electrical characteristic requirements.

62. The system as recited in claim 59, wherein the first IC is the device under test and the second IC is a reference IC.

63. The system as recited in claims 62, wherein the reference IC is an IC determined to meet all functional requirements and all electrical characteristic requirements.

64. The system as recited in claim 59, wherein, in the I/O transmissions between the first IC and the second IC, the first IC and the second IC are configured for source synchronous transmissions.

65. The system as recited in claim 59, wherein, in the I/O transmissions between the first IC and the second IC, the first IC and the second IC are configured for asynchronous transmissions.

66. The system as recited in claim 59, wherein, in the I/O transmissions between the first IC and the second IC, the first IC and the second IC are configured for transmissions synchronized to a single system-wide clock.

67. The system as recited in claim 59, further comprising conducting an interconnect built-in self test between a transmitter of the first IC and a receiver of the second IC, wherein conducting the interconnect built-in self test comprises testing signal connections between the first IC and the second IC.

68. The system as recited in claim 59, wherein the first test data comprises a test pattern having a plurality of bits, and wherein the test pattern is serially shifted from the test system to the JTAG input of the first IC.

69. The system as recited in claim 59, wherein the first test data comprises a command to the first IC to invoke a test sequence.

70. The system as recited in claim 59, wherein the second test data is produced responsive to the I/O transmissions between the first IC and a second IC.

71. The system as recited in claim 70, wherein the second test data comprises a pattern having a plurality of bits.

72. The system as recited in claim 71, wherein the system is further configured to compare the second test data to an expected data pattern to determine the pass/fail status for the device under test.

73. The system as recited in claim 70, wherein the second test data comprises a pass/fail indication, the pass/fail indication produced responsive to conducting a test between the first IC and the second IC.

* * * * *